(12) United States Patent
Ding et al.

(10) Patent No.: US 7,760,844 B2
(45) Date of Patent: Jul. 20, 2010

(54) MULTI-MODULUS DIVIDER WITH EXTENDED AND CONTINUOUS DIVISION RANGE

(75) Inventors: Jian-Yu Ding, Hsinchu County (TW); Shen-Ching Sun, Hsinchu County (TW); Yao-Chi Wang, Hsinchu County (TW); Chao-Tung Yang, Tai-Nan (TW); Fucheng Wang, Hsinchu County (TW); Shuo-Yuan Hsiao, Hsinchu (TW)

(73) Assignee: MStar Semiconductor, Inc., ChuPei, Hsin-Chu Hsien (TW)

( * ) Notice: Subject to any disclaimer, the term of this patent is extended or adjusted under 35 U.S.C. 154(b) by 66 days.

(21) Appl. No.: 12/363,792

(22) Filed: Feb. 2, 2009

(65) Prior Publication Data
US 2009/0213980 A1 Aug. 27, 2009

(30) Foreign Application Priority Data
Feb. 26, 2008 (TW) .............................. 97106604 A

(51) Int. Cl.
*H03K 21/00* (2006.01)
(52) U.S. Cl. .......................................... 377/47; 377/48
(58) Field of Classification Search ....................... None
See application file for complete search history.

(56) References Cited

U.S. PATENT DOCUMENTS

| | | | |
|---|---|---|---|
| 6,760,397 B2 * | 7/2004 | Wu et al. ....................... 377/47 |
| 7,564,276 B2 * | 7/2009 | Narathong et al. ........... 327/117 |
| 2002/0186808 A1 * | 12/2002 | Kouznetsov et al. ........... 377/47 |
| 2005/0258878 A1 * | 11/2005 | Neurauter et al. ............ 327/115 |
| 2007/0147571 A1 * | 6/2007 | Yu et al. ........................ 377/47 |
| 2007/0160179 A1 * | 7/2007 | Narathong et al. ............ 377/47 |

* cited by examiner

*Primary Examiner*—Tuan Lam
(74) *Attorney, Agent, or Firm*—Winston Hsu

(57) ABSTRACT

A multi-modulus divider and a method for performing frequency dividing by utilizing a multi-modulus divider are disclosed. The multi-modulus divider comprises a multi-modulus dividing circuit, a pulse generating circuit, and a modulus signal generating circuit. The multi-modulus dividing circuit comprises several serially connected divider cells, of which a predetermined one may be bypassed. The multi-modulus dividing circuit generates an output frequency according to an input frequency and a divisor. A range of the divisor comprises a plurality of numerical intervals. The pulse generating circuit generates a pulse signal. The modulus signal generating circuit generates a determination result by determining which numerical interval the divisor belongs to, and inputs, according to the determination result, the pulse signal into the predetermined divider cell to be one of references which the predetermined divider cell refers to when outputting a modulus signal. The predetermined divider cell corresponds to the determination result.

20 Claims, 9 Drawing Sheets

MULTI-MODULUS DIVIDER WITH EXTENDED AND CONTINUOUS DIVISION RANGE

BACKGROUND OF THE INVENTION

1. Field of the Invention

The present invention relates to a multi-modulus divider, and more particularly to a multi-modulus divider with an extended and continuous division range.

2. Description of the Prior Art

In order to implement products complying with the increasingly complicated communication specifications, a frequency synthesizer is often demanded to be capable of performing wide-range frequency syntheses of a wide range to match up with all kinds of crystal oscillators, as well as to be capable of synthesizing frequencies of both integral and fractional multiples.

FIG. 1 is a schematic diagram of a programmable dividing circuit 100 commonly used in a frequency synthesizer, wherein the programmable dividing circuit 100 comprises a plurality of divider cells 110 connected in series (six divider cells are included in this example). Each divider cell 110 is controlled by a programming input signal $P_{IN}$ to perform a frequency division with a divisor of 2 or 3. In this example, the least significant bit (LSB) of the programming input signal $P_{IN}$ is $P_{IN\_0}$, and the most significant bit (MSB) of the programming input signal $P_{IN}$ is $P_{IN\_5}$. For example, when the LSB $P_{IN\_0}$ of the programming input signal $P_{IN}$ is 0, the divider cell 110a will divide the input frequency by 2. On the other hand, when the LSB $P_{IN\_0}$ of the programming input signal $P_{IN}$ is 1, the divider 110a will divide the input frequency by 3. In each division cycle, the last divider 110f generates a modulus signal $MO_6$ and transmits the same to the divider 110e. And the modulus signal $MO_6$ is reclocked by the divider 110e to become the modulus signal $MO_5$ and is further transmitted until the divider 100a generates the modulus signal $MO_1$. However, only when the status of the modulus signal is logical "1", the divider 110 loads programming input signal $P_{IN}$ and performs frequency division according to the instruction of the programming input signal $P_{IN}$.

The division range of the dividing circuit 100 covers from $2^N$ to $2^{(N+1)}-1$. The greatest frequency generated by the dividing circuit 100 is only about two times greater than the least frequency generated by the dividing circuit 100. Therefore, there are many limitations in practical applications.

An improved dividing circuit 200 is shown in FIG. 2. At the modulus signal output terminals of some dividers such as the dividers 110d-100f in this example, are logic circuits comprising OR gates, where the logic circuits are utilized for selectively bypassing the results of frequency division of the dividers 110d-110f. For example, if the $P_{IN\_6}$ is set to "0", no matter what status of the modulus signal $MO_6$ is, the logic gate 222f outputs "1" to the modulus signal input terminal of the divider 110e. This behavior means that the divider cell 110f is abandoned and the divider cell 110a-110e will generate the dividing output of the dividing circuit 200. When the values of the $P_{IN\_6}$ and $P_{IN\_5}$ are both set to "0", no matter what values of the modulus signals $MO_5$ and the $MO_6$ are, the logic gate 222e outputs "1" to the modulus signal input terminal of the divider cell 110d, which means that the divider cell 110e and the divider cell 110f are both abandoned. Therefore, the number of the divider cells in the dividing circuit 200 that truly influence the output frequency can be properly adjusted by setting the programming input signal $P_{IN}$. Accordingly, compared to the diving circuit shown in FIG. 1, the division range of the dividing circuit 200 can be extended down to $2^M$, wherein M represents the number of divider cells that cannot be bypassed. It should be noted that $N>M\geq 1$.

Although the dividing circuit 200 has an advantage of a wide range by means of bypassing some divider cells, it is strictly limited when the architecture of the dividing circuit 200 is applied to a fraction-N frequency synthesizer. This is because the fractional-N frequency synthesizer requires the operation result of each division cycle to be correct. However, since the divisor changes in each cycle, the same divisor cannot wait more cycles for the operation result to become correct—such occurrence is one of the biggest differences between the fractional-N frequency synthesizer and the general frequency synthesizer. The modulus signals of the bypassed divider cells in the dividing circuit 200 do not certainly have logical "1" in each division cycle, so some divisors may not be loaded correctly. This error occurs while the division ratio hops from less than $2^K$ to greater than or equal to $2^K$, wherein K is a positive integer. An example of K=6 is shown in FIG. 3, which illustrates the waveforms of modulus signals $MO_1, MO_2, \ldots,$ and $MO_6$ of the dividing circuit 200 when the value of the divisor hops from 63 to 64. As the divider cell 110f is bypassed in the cycles when the divisor is less than 64 (e.g., the division cycles of 62 or 63 in the figure), the modulus signal $MO_6$ depends only on $FO_6$, such that the cycle of the modulus signal $MO_6$ is twice or triple of the desired division cycle. At this moment, the cycles of $MO_1, MO_2, \ldots,$ and $MO_5$ are desired cycles corresponding to the input $P_{IN}$. As a result, when entering the cycle of the divisor of 64, the modulus signal $MO_6$ stays at logical "0"; therefore the divider cell 110 cannot further load the value of the $P_{IN\_5}$ correctly. In order not to have a divisor of zero, the dividing circuit 200 will force the $P_{IN\_4}$ to be 1. The division cycle originally corresponding to a divisor of 64 becomes the division cycle corresponding to a divisor of 32, making the multi-modulus divider output a wrong frequency. For the entire frequency synthesizer, this kind of error usually reflects on the output via the mechanism of narrow-band frequency modulation (FM), causing the overall phase noise to become much worse and unendurable, and even causing out-of-lock.

In short, although the division range of the dividing circuit 200 appears to cover from $2^M$ to $2^{(N+1)}-1$, it is in fact ensured that no error occurs on the output frequency of the multi-modulus divider only when the divisor variance does not exceed respective intervals of $[2^M, (2^{(M+1)}-1)]$, $[2^{M+1}, (2^{(M+2)}-1)], \ldots,$ and $[2^N, (2^{(N+1)}-1)]$. A correct division, however, cannot be guaranteed in one division cycle for each division in the entire division range of $2^M$ to $2^{(N+1)}-1$.

The current trend in modern applications is that a single circuit must be able to support different reference frequencies (i.e., the reference frequency changes in accordance with different standards of crystal oscillators, such as 13 MHz or 26 MHz for GSM, 19.2 to 19.8 MHz for CDMA, 16 MHz for GPS, and 15.36 MHz for WCDMA). Taking a GPS chip for example, it uses only one crystal oscillator of 16 MHz in the single application of GPS, while having to support the reference frequency of a mobile phone, such as 13 MHz or 26 MHz, when the chip is collocated in a mobile phone. If the fractional-N synthesizer supports more standards of crystals, it inevitably faces changes in the division value (i.e., divisor), which may hop from less than $2^K$ to greater than or equal to $2^K$; as a result, the above-mentioned dividing circuit 200 is not suitable anymore.

SUMMARY OF THE INVENTION

It is therefore one objective of the present invention to provide a multi-modulus divider with extended and continuous division, and a frequency dividing method thereof. Even though the value of the divisor hops from less than $2^K$ to greater than or equal to $2^K$, the divisor will be loaded correctly within a single cycle to perform a frequency division operation accurately. Therefore, it can be extensively applied to any fractional-N frequency synthesizer and is not limited by the value of the divisor or the reference frequency. The present invention can be applied to a GPS system and can further be applied to any integrated platform greatly in the trends of integrating several platforms, for example, integrating digital TVs and mobile phones, integrating digital TVs, GPS, and wired/wireless communications such as Bluetooth, etc.

According to an embodiment of the present invention, a multi-modulus divider is disclosed. The multi-modulus divider comprises a multi-modulus dividing circuit, a pulse generating circuit, a modulus signal generating circuit coupled to the multi-modulus dividing circuit and the pulse generating circuit. The multi-modulus dividing circuit comprises a plurality of serially connected divider cells, of which a predetermined one is able to be bypassed. The multi-modulus dividing circuit generates an output frequency according to an input frequency and a divisor, wherein a range of the divisor comprises a plurality of numerical intervals. The pulse generating circuit generates a pulse signal. The modulus signal generating circuit generates a determination result by determining which numerical interval the divisor belongs to, and inputs, according to the determination result, the pulse signal into the predetermined divider cell to be one of references which the predetermined divider cell refers to when outputting a modulus signal, wherein the predetermined divider cell corresponds to the determination result.

According to another embodiment of the present invention, a method for performing frequency dividing by utilizing a multi-modulus divider is disclosed. The multi-modulus dividing circuit comprises a plurality of serially connected divider cells, of which a predetermined one is able to be bypassed. The multi-modulus dividing circuit generates an output frequency according to an input frequency and a divisor, and a range of the divisor comprises a plurality of numerical intervals.

The method for performing frequency dividing by utilizing the multi-modulus divider comprises steps of: generating a pulse signal; generating a determination result by determining which numerical interval the divisor belongs to; and inputting, according to the determination result, the pulse signal into the predetermined divider cell to be one of references which the predetermined divider cell refers to when outputting a first modulus signal, wherein the predetermined divider cell corresponds to the determination result.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
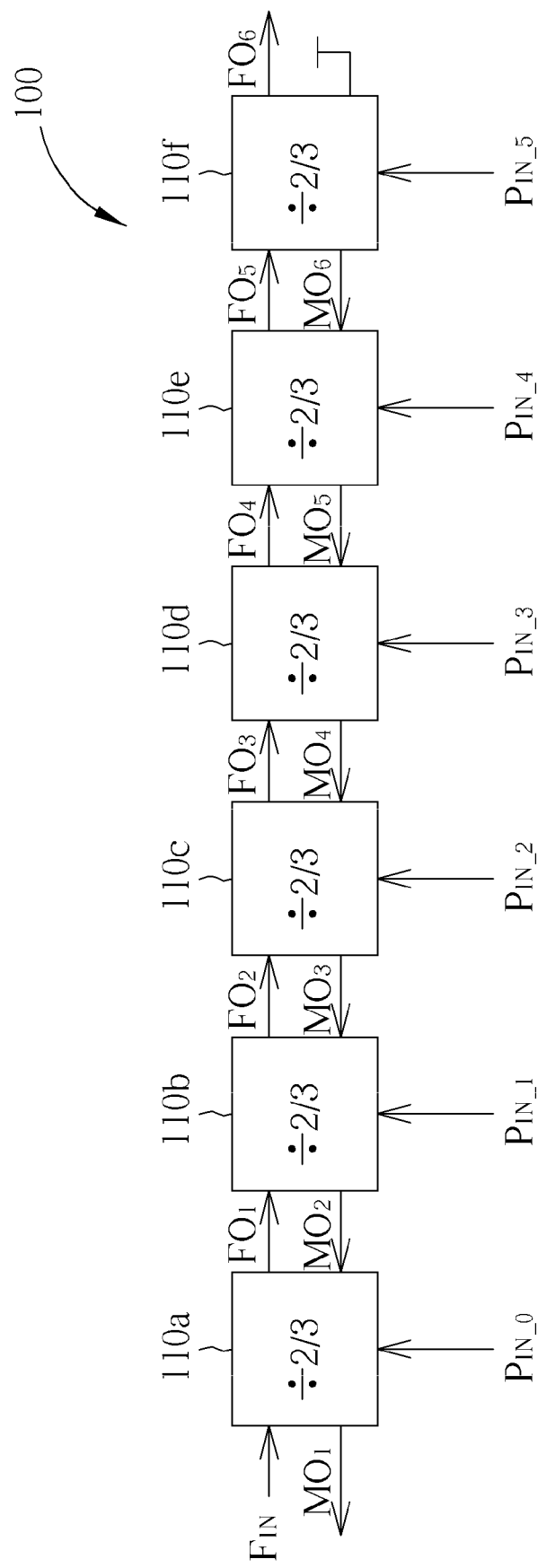
FIG. 1 is a diagram of the structure of a conventional programmable divider.
Figure 2:
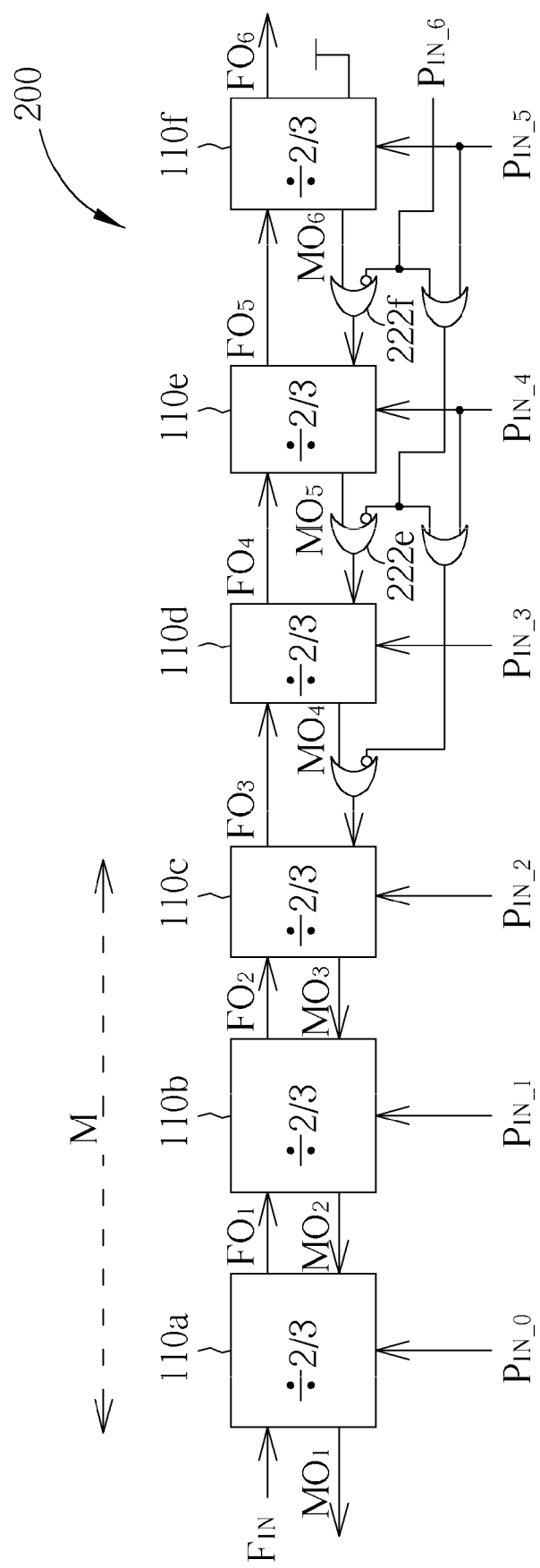
FIG. 2 is a diagram of the structure of an improved conventional programmable divider.
Figure 4:
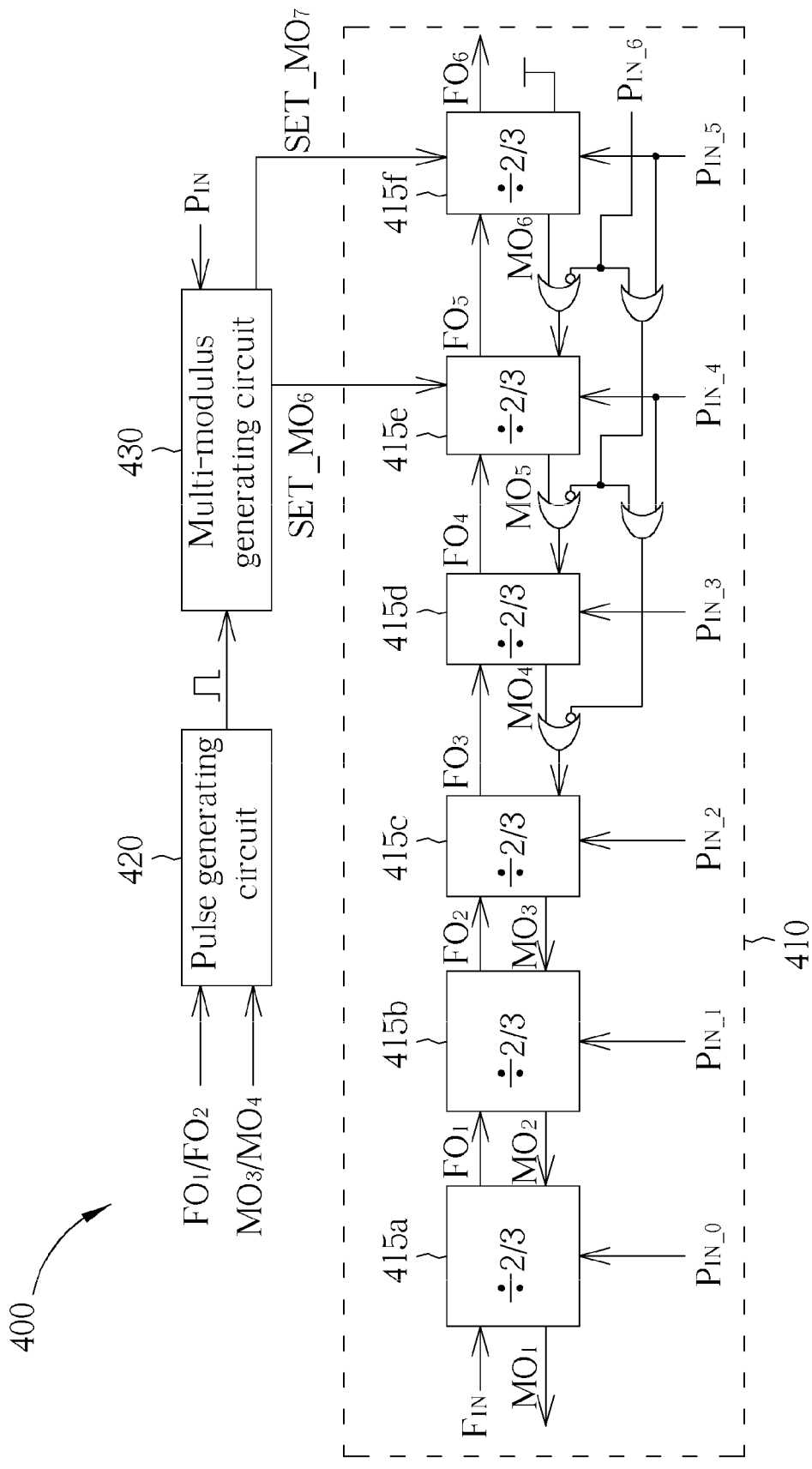
FIG. 4 is a diagram of a multi-modulus divider according to an embodiment of the present invention.

Please refer to FIG. 4 illustrating a multi-modulus divider according to the embodiment of the present invention. As shown in FIG. 4, the multi-modulus divider 400 comprises a multi-modulus dividing circuit 410, which mainly consists of a plurality of divider cells 415a-415f and some logic circuits. Note that at least one divider cell from the plurality of divider cells 415a-415f may be bypassed. In this embodiment, the multi-modulus divider 410 comprises logic gates installed at the modulus signal output terminals of the divider cells 415d, 415e, and 415f to form bypassing paths, which are identical to those shown in FIG. 2. The operation procedures thereof are the same as those mentioned above, so the detailed descriptions regarding the multi-modulus divider 410 are omitted. However, this is for illustrative purposes only, and is not meant to be a limitation of the present invention. According to variations of this embodiment, other methods for implementing the paths for bypassing can be applied. In addition, according to variations of this embodiment, another number of divider cells that may be bypassed can be utilized.

According to an input frequency $F_{IN}$ and a divisor such as the programming input signal $P_{IN}$, the multi-modulus divider 410 generates an output frequency. The divisor $P_{IN}$ can be represented as a combination of binary codes. In this embodiment, the divisor $P_{IN}$ comprises six bits (i.e., $P_{IN\_0}$, $P_{IN\_1}$, ..., and $P_{IN\_5}$). As mentioned above, when the divisor hops from less than $2^K$ to greater than or equal to $2^K$, the conventional multi-modulus divider cannot guarantee the divisor to be loaded correctly. To solve this problem, the multi-modulus divider 400 further comprises a pulse generating circuit 420 for generating a pulse signal, and a modulus signal generating circuit 430 for transmitting the pulse signal to a predetermined divider cell 415 (which is the divider cell 415e or 415f in this embodiment) in order to provide the predetermined divider cell 415 with the pulse signal to be one of the references the predetermined divider cell 415 refers to when outputting a modulus signal. Thus, in this embodiment, a pseudo-modulus signal is generated to make the multi-modulus dividing circuit 410 load the divisor correctly.

For example, the multi-modulus dividing circuit 410 bypasses the divider cell 415e when the divisor falls within the numerical interval of [16, 31]. In order to prevent the divider cell 415e from loading the divisor incorrectly when the value of the divisor hops from less than 32 to greater than or equal to 32, the modulus signal generating circuit 430 transmits the pulse signal of the pulse generating circuit 420 to the divider cell 415e in order to force the signal $MO_5$ to be logical "1" within the division cycle. Similarly, because the multi-modulus dividing circuit 410 bypasses the divider cell 415f when the divisor falls within the numerical interval from less than 64 to greater than or equal to 32, the modulus signal generating circuit 430 inputs the pulse signal to the divider cell 415*f* in order to force the $MO_6$ to be logical "1" within the division cycle, guaranteeing that the divider cell 415*f* loads the $P_{IN\_5}$ correctly. Accordingly, the modulus signal generating circuit 430 determines which divider cell 415 the pulse signal should be transmitted into according to which numerical interval the divisor belongs to.

Figure 5:
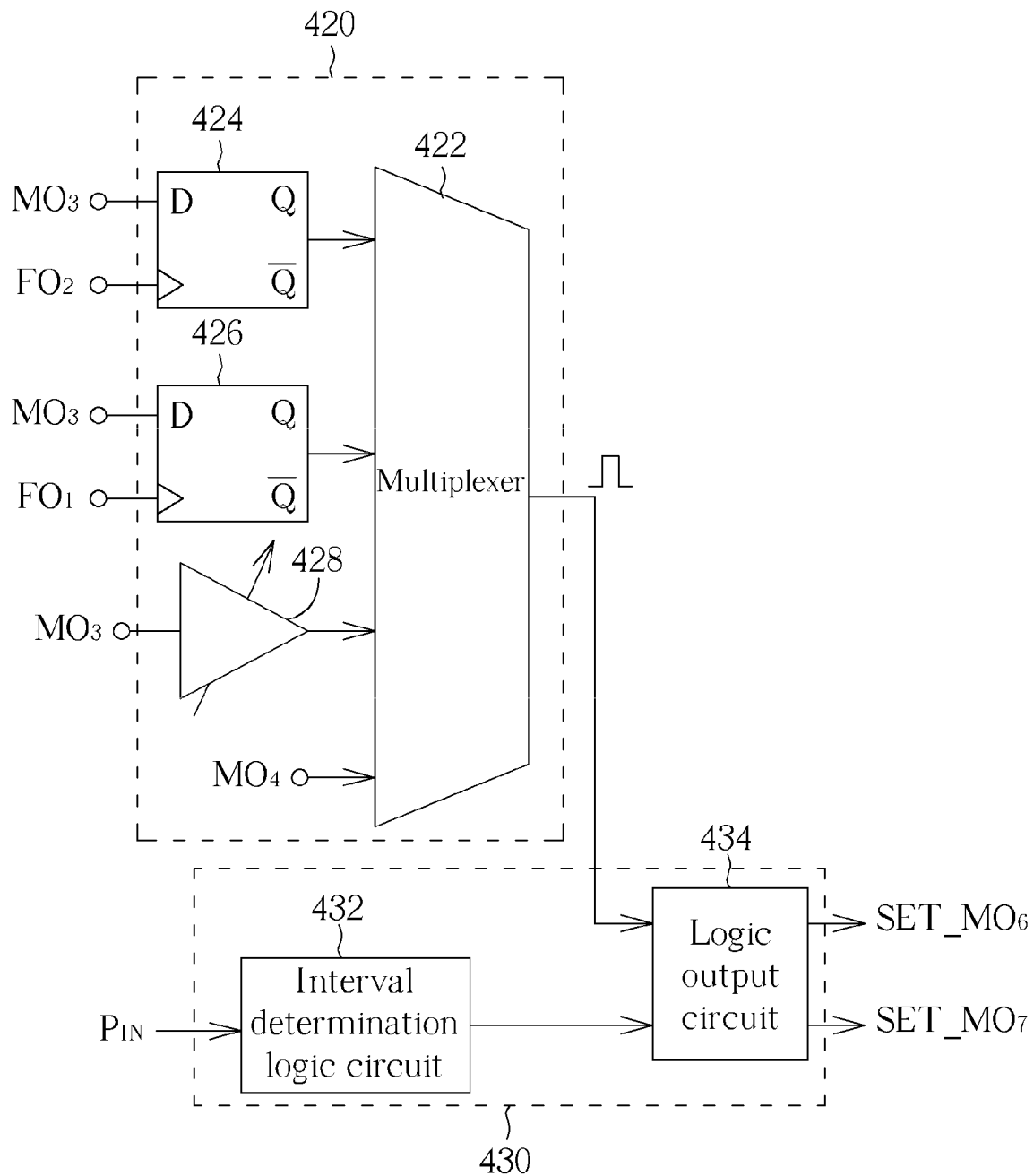
FIG. 5 is a diagram of the pulse generating circuit and the modulus signal generating circuit shown in FIG. 4 according to an embodiment of the present invention.

Please further refer to FIG. 5 showing a diagram of the pulse generating circuit 420 and the modulus signal generating circuit 430 according to an embodiment of the present invention. The modulus signal generating circuit 430 comprises an interval determination logic circuit 432 for determining which numerical interval the divisor belongs to according to some or all bits of the divisor $P_{IN}$. In this embodiment, the numerical intervals are respective intervals ranging from $2^K$ to $(2^{(K+1)}-1)$, with a positive integer K being greater than or equal to 4. That is, a range of the divisor comprises a plurality of numerical intervals, and the interval determination logic circuit can determine which of the numerical intervals [16, 31], [32, 63] or [64, 127] the divisor falls within. The determination result of the interval determination logic circuit 432 is then inputted into a logic output circuit 434, which in turn inputs the pulse signal into a predetermined divider cell according to the determination result. For example, when the determination result indicates that the divisor belongs to the numerical interval of [32, 63], the logic output circuit 434 inputs the pulse signal (i.e., the pulse signal $SET\_MO_7$ shown in the figures FIGS. 4 and 5) into the divider cell 415*f* in order to make the modulus signal $MO_6$ be logical "1" in the division cycle. In another case when the determination result indicates that the divisor belongs to the numerical interval of [16, 31], the logic output circuit 434 inputs the pulse signal (i.e., the pulse signal $SET\_MO_6$ shown in the figures FIGS. 4 and 5) into the divider cell 415*e*.

Figure 6:
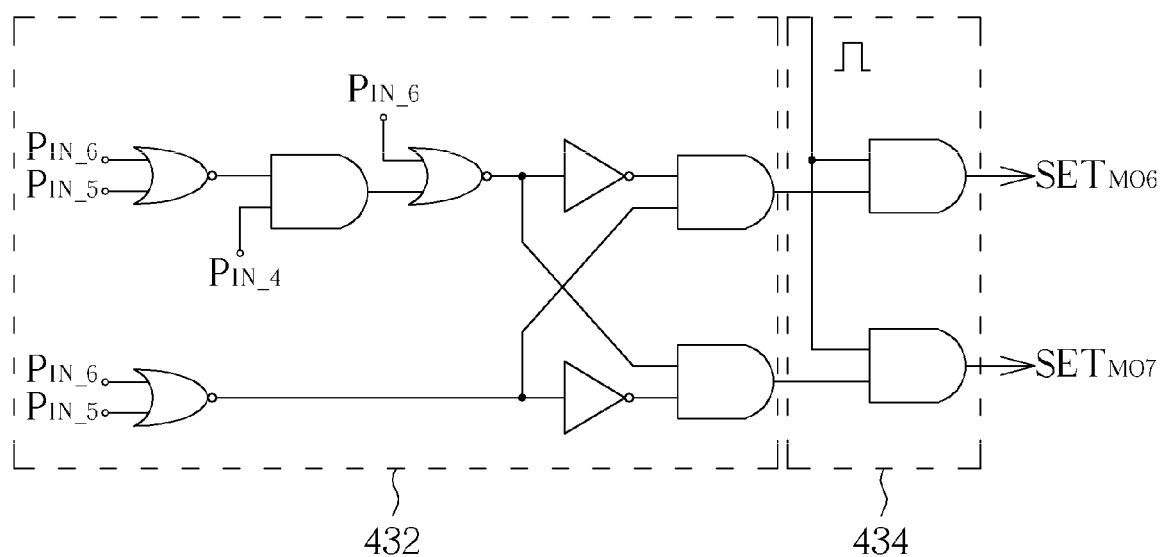
FIG. 6 is a diagram of the interval determination logic circuit and the logic output circuit shown in FIG. 5 according to an embodiment of the present invention.

Both the interval determination logic circuit 432 and the logic output circuit 434 can be implemented with a plurality of logic gates. FIG. 6 is a diagram of the interval determination logic circuit 432 and the logic output circuit 434 according to one embodiment of the present invention.

An example is described below to explain how the signals $SET\_MO_7$ or $SET\_MO_6$ outputted by the modulus signal generating circuit 430 is utilized for generating the pseudo-modulus signal $MO_6$ or $MO_5$ within a predetermined cycle. Please refer to FIG. 7, which illustrates a block diagram of the predetermined divider cell 415*e* (or 415*f*) coupled to the modulus signal generating circuit 430. The predetermined divider cell 415*e* (or 415*f*) comprises a dividing module 710 and a modulus signal processing circuit 720. The dividing module 710 receives an input frequency $F_{IN}$ and generates an output frequency $F_{OUT}$ which is ½ or ⅓ of the input frequency $F_{IN}$. The modulus signal processing circuit 720 receives the modulus signal $MOD_{IN}$ from the previous divider cell and outputs a re-clocked modulus signal $MOD_{OUT}$ (i.e., $MO_5$ or $MO_6$) to the next divider cell. In comparison with the conventional divider, in addition to the first logic circuit 722 and the third logic circuit 726, the modulus signal processing circuit 720 further comprises a second logic circuit 724 (which is implemented by an OR gate in this embodiment) coupled to the modulus signal generating circuit 430. After the first logic circuit 722 generates a first output signal $OUT_1$ according to an output signal of the dividing module 710 and an input modulus signal $MOD_{IN}$, the OR gate 724 performs a logic-OR operation on the first output signal $OUT_1$ and the pulse signal (i.e., $SET\_MO_7$ or $SET\_MO_6$) to generate a second output signal $OUT_2$. Then the third logic circuit 726 generates a modulus signal $MOD_{OUT}$ according to the second output signal $OUT_2$. Thus, when the SET pin does not have an input, the predetermined divider cell 415*e* (or 415*f*) operates the same as the conventional divider cell; however, when the pulse signal is inputted into the SET pin, the modulus signal processing circuit 720 still can use the pulse signal as a reference when generating the modulus signal of the predetermined divider cell 415*e* (or 415*f*) even if the first output signal $OUT_1$ is not logical "1" within the division cycle. In contrast to the conventional structure, the procedure described above is equivalent to providing a pseudo input signal $MOD_{IN}$ to generate proper output signal $MOD_{OUT}$, and this scheme is thus called pseudo-modulus. It can be ensured that the modulus signal $MOD_5$ (or $MOD_6$) of the predetermined divider cell 415*e* (or 415*f*) is logical "1" when the divisor varies within a predetermined division cycle so that the divisor can be loaded correctly.

Figure 7:
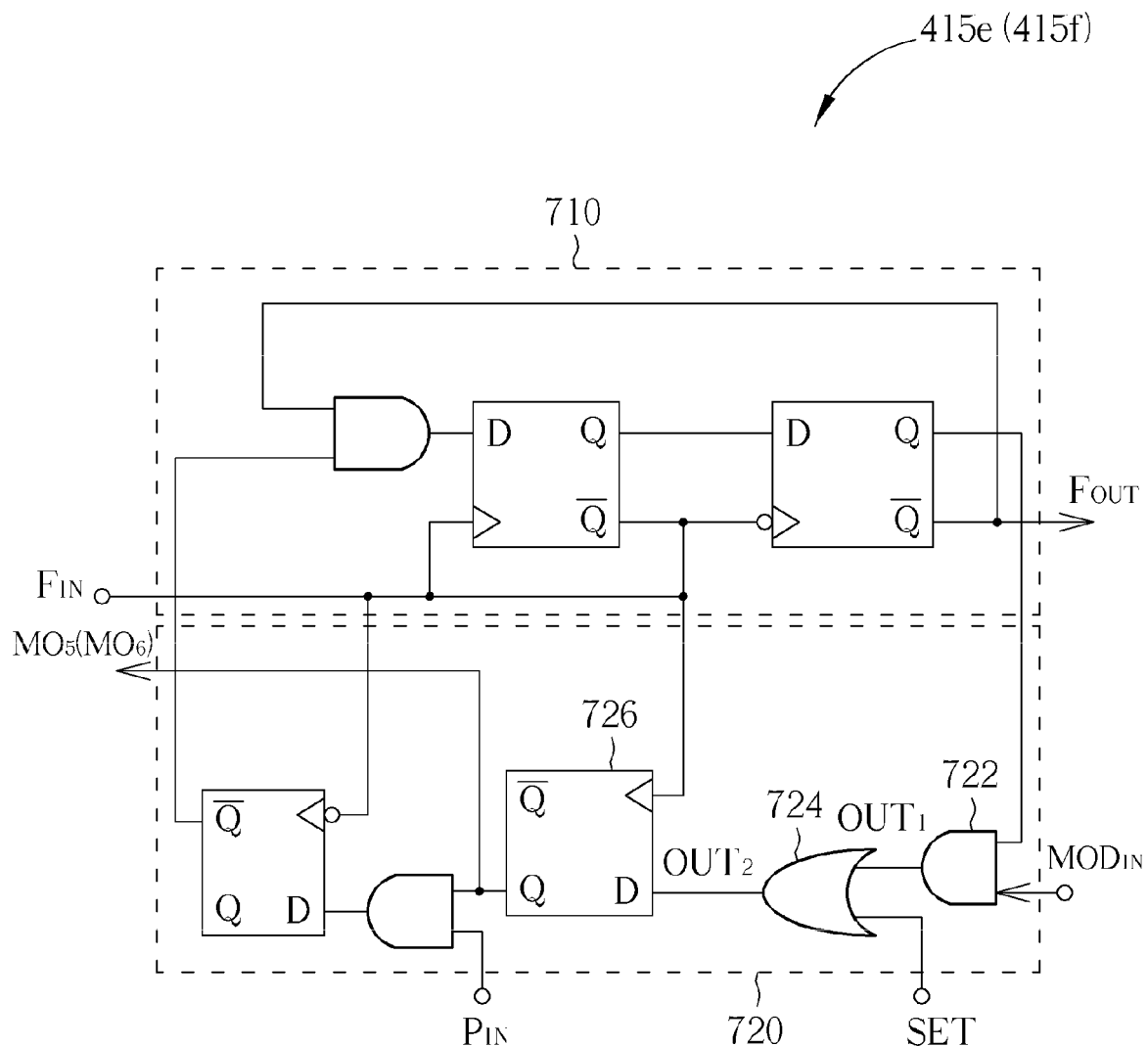
FIG. 7 is a diagram of the circuit structure of a predetermined divider cell of the multi-modulus divider shown in FIG. 4 according to an embodiment of the present invention.

Please note that the circuit structure shown in FIG. 7 is only applied to the predetermined divider cells 415*e* and 415*f* in the aforementioned embodiment; this is, however, only for illustrative purposes only, and is not meant to be a limitation of the present invention. As the range of the divisor varies from 16 to 127 in this embodiment, only the situations where the value of the divisor hops from the numerical interval of [16, 31] to the numerical interval of [32, 63] and from the numerical interval of [32, 63] to the numerical interval of [64, 127] are discussed. According to a variation of this embodiment, the divisor received by the multi-modulus dividing circuit 410 may fall within other numerical intervals, and the corresponding divider cells 415 can be implemented by utilizing the circuitry shown in FIG. 7. The modulus signal generating circuit 430 selects a predetermined divider cell from those divider cells according to the value of the divisor and inputs the pulse signal into the SET pin of the predetermined divider cell.

Figure 3:
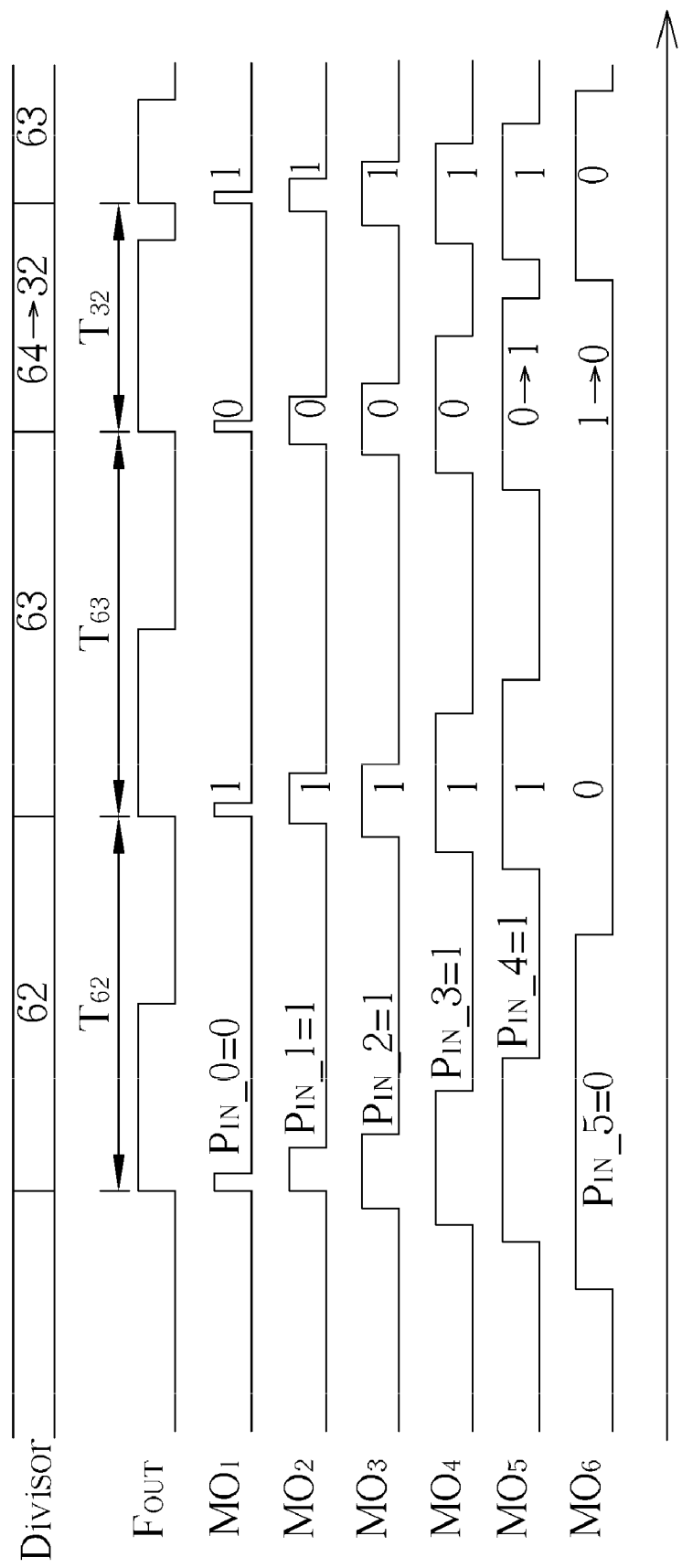
FIG. 3 is a diagram of the waveforms of the divider shown in FIG. 2 when the value of the divisor hops from 63 to 64.
Figure 8:
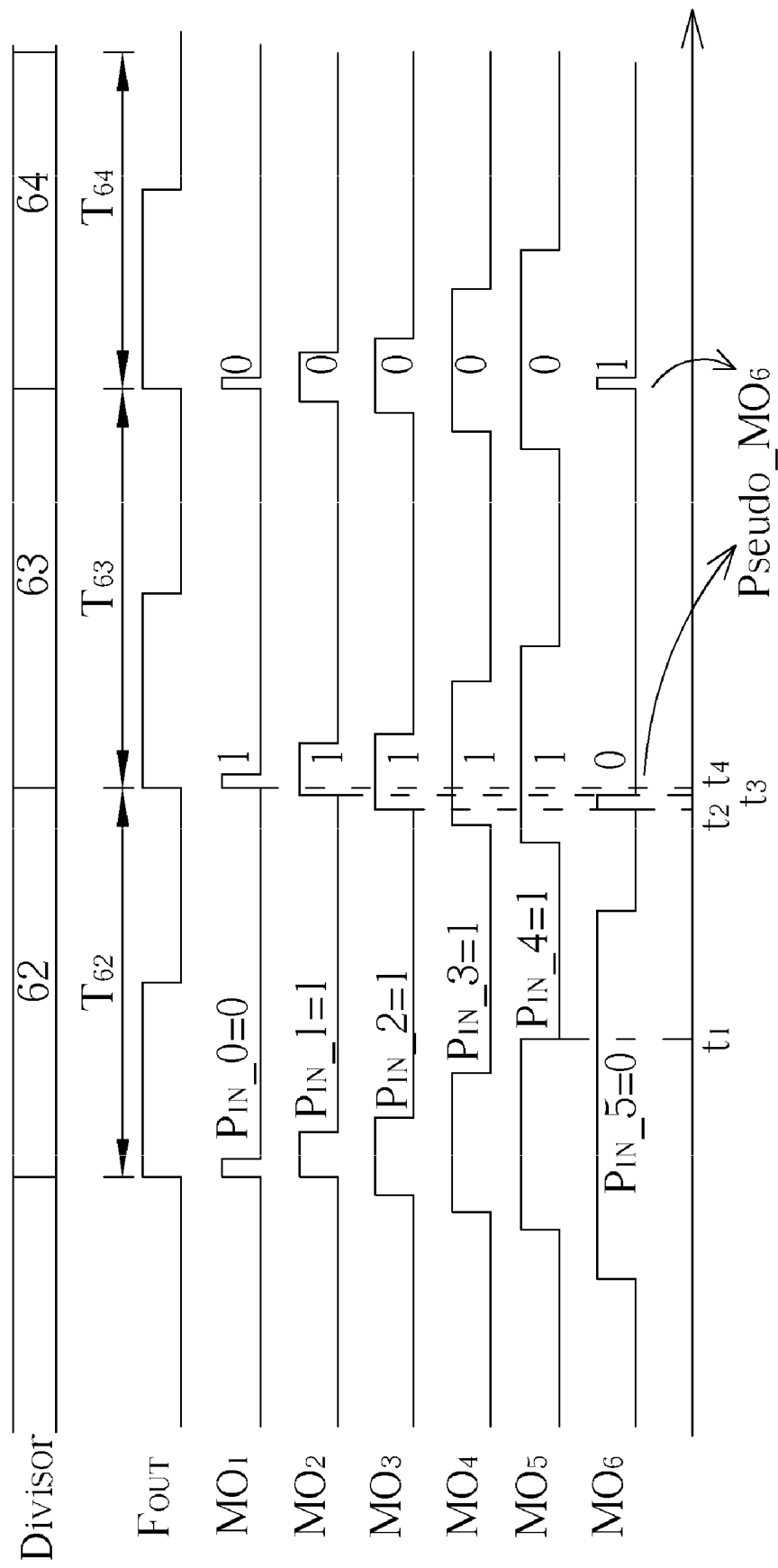
FIG. 8 is a diagram of the waveforms of a plurality of modulus signals of the multi-modulus divider shown in FIG. 4 when the value of the divisor hops from 63 to 64.

Now assuming that the divisor hops from 63 to 64, the waveforms of the modulus signals $MO_1, MO_2, \ldots,$ and $MO_6$ of the multi-modulus dividing circuit 410 are as illustrated in FIG. 8. In contrast to the waveforms shown in FIG. 3, the modulus signal generating circuit 430 inputs the signal $SET\_MO_7$ into the predetermined divider cell 415*f* within the predetermined time interval, resulting in a pulse signal (i.e., the signal $Pseudo\_MO_6$ shown in FIG. 8) generated within the division cycle of the $MO_6$ originally at logical "0". Therefore, the predetermined divider cell 415*f* is able to correctly load $P_{IN\_5}=1$ in the division cycle of the divisor of 64, and thus the prior art problem is solved. As a result, the multi-modulus dividing circuit 410 of this embodiment has a continuous division range, and is therefore suitable for implementing a variety of fraction-N frequency synthesizers corresponding to different reference frequencies of different crystal oscillators.

It should be noted that, in this embodiment, the timing when the predetermined divider cell 415*f* loads the value of $P_{IN\_5}$ can fall between the falling edge of the signal $MO_5$ and the rising edge of the signal $MO_1$, i.e., between $t_1$ and $t_4$ as shown in FIG. 8, provided that the multi-modulus divider 400 does not perform frequency division with the divisor hopping from one interval to another (which means that the divisor does not hop from less than $2^K$ to greater than or equal to $2^K$). However, when the divisor may hop across the boundary between $(2^K-1)$ and $2^K$, the timing when the predetermined divider cell 415*f* loads the value of $P_{IN\_5}$ had better fall between the rising edge of the signal $MO_3$ and the rising edge of the signal $MO_2$, i.e., between $t_2$ and $t_3$ shown in FIG. 8. In this embodiment, this interval is suitable for the divisors falling between 16 and 127. Therefore, the pulse generating circuit 420 is utilized for not only generating a pulse signal but also controlling the rising edge of the pulse signal to fall within a predetermined time interval.

Please refer to FIG. 5 again. The pulse generating circuit 420 can sample the signal $MO_3$ with the output frequency $FO_2$ of the divider cell 415b, sample the signal $MO_3$ with the output frequency $FO_1$ of the divider cell 415a, or delay the signal $MO_3$ to generate the pulse signal whose rising edge falls between $t_2$ and $t_3$. In short, there are many methods for making the generated pulse signal fall within a preferred interval (e.g., between $t_2$ and $t_3$ in this embodiment). Besides, when it is certain that the multi-modulus divider 400 does not perform the frequency division with the divisor hopping from one interval to another (i.e., the divisor will not hop from less than $2^K$ to greater than or equal to $2^K$), the signal $MO_4$ can also be directly utilized as the pulse signal outputted by the pulse generating circuit 420 (in this case, the generated pulse signal falls within the interval between $t_1$ and $t_4$). When it is certain that the divisor is definitely greater than or equal to 32, the pulse signal can be generated by methods of delaying the output $MO_4$ of the divider cell 415d, sampling signal $MO_4$ with $FO_3$, sampling signal $MO_4$ with $FO_2$, sampling signal $MO_4$ with $FO_1$, etc.

In this embodiment, the pulse generating circuit 420 utilizes a multiplexer 422 to select one input to be an output signal. According to a variation of this embodiment, the pulse generating circuit 420 can simply contain the inverter 424, the inverter 426, or the variable delaying circuit 428 to achieve substantially the same effect. In another embodiment, the pulse generating circuit 420 and the modulus signal generating circuit 430 can be integrated into the same module rather than being implemented in individual ones. For example, after a pulse signal is generated and a divider cell which the pulse signal should be inputted into is determined according to the numerical interval to which the divisor belongs, the rising edge of the pulse signal is adjusted to fall within a predetermined time interval and the pulse signal is inputted into the predetermined divider cell.

Figure 9:
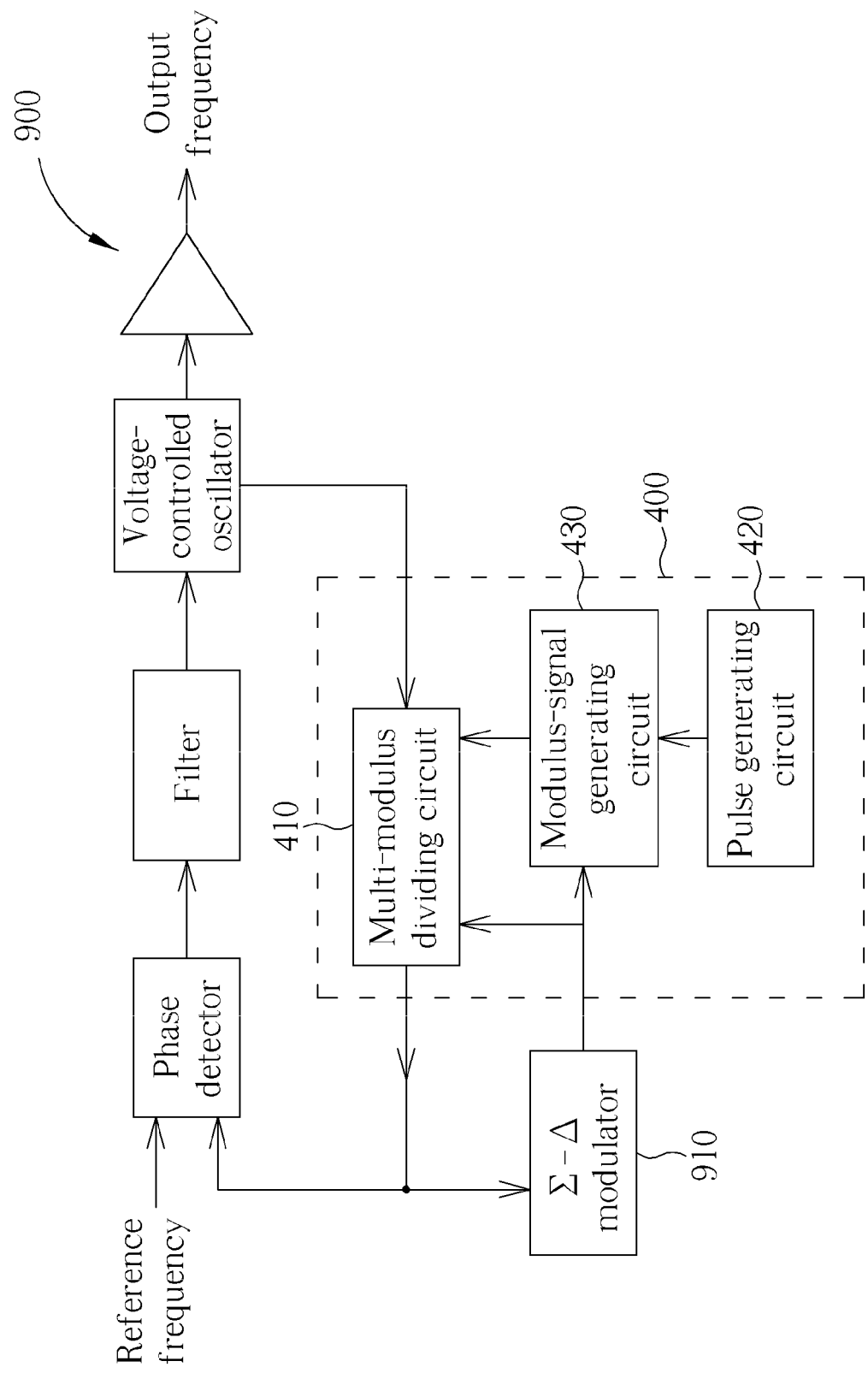
FIG. 9 is a block diagram of the multi-modulus divider shown in FIG. 4 applied to a fractional-N synthesizer according to an embodiment of the present invention.

Due to the above-mentioned characteristics, the multi-modulus divider 400 is applicable to a fractional-N synthesizer. FIG. 9 is a diagram of the multi-modulus divider 400 shown in FIG. 4 applied to a fractional-N synthesizer 900 according to one embodiment of the present invention. The fractional-N synthesizer 900 utilizes a Σ-Δ modulator 910 (which is also referred to as a triangular integration modulator) to generate a divisor to the multi-modulus divider 400 in each division cycle. The variance range of the divisor is determined by the number of orders of the Σ-Δ modulator 910. For example, when the variation range of a third-order Σ-Δ modulator is between −3 and 4 and if the input division value is 60.123, the divisor can be any integer between 57 (60−3) and 64 (60+4). The averaged divisor will be 60.123 for operations during a long period of time. Because the frequency range of the output of the frequency synthesizer 900 is fixed, different crystal oscillators correspond to different division values (please note that the output frequency is equal to the reference frequency multiplied by the division value). As a result, the value of the divisor usually hops from $(2^K-1)$ to $2^K$ when different crystal oscillators are applied.

The pulse generating circuit 420 generates a pulse signal in each division cycle and the modulus signal generating circuit 430 determines which divider cell of the multi-modulus dividing circuit 410 the pulse signal should be inputted into, so the multi-modulus dividing circuit 410 can correctly load the divisor in each division cycle. In contrast to the conventional divider, as the multi-modulus divider 400 has an extended and continuous division range, and can perform continuous frequency division with the divisor varying from $2^M$ to $(2^{(N+1)}-1)$ without the limitation of incapability of hopping from less than $2^K$ to greater than or equal to $2^K$ within one cycle, the convenience and flexibility for designing the fractional-N synthesizers can be optimized in practical applications.

The present invention can be applied to a GPS system and can further be applied to any integrated platform extensively in the trends of integrating several platforms, for example, integrating digital TVs and mobile phones, integrating digital TVs, GPS, and wired/wireless communications such as Bluetooth, etc.

Those skilled in the art will readily observe that numerous modifications and alterations of the device and method may be made while retaining the teachings of the invention.

What is claimed is:

1. A multi-modulus divider, comprising:
   a multi-modulus dividing circuit comprising a plurality of divider cells connected in series, and a predetermined divider cell of the divider cells being able to be bypassed, the multi-modulus dividing circuit generating an output frequency according to an input frequency and a divisor, wherein a range of the divisor comprises a plurality of numerical intervals;
   a pulse generating circuit, for generating a pulse signal; and
   a modulus signal generating circuit, coupled to the multi-modulus dividing circuit and the pulse generating circuit, for generating a determination result by determining which numerical interval the divisor belongs to, and inputting, according to the determination result, the pulse signal into the predetermined divider cell to be one of the references which the predetermined divider cell refers to when outputting a first modulus signal,
   wherein the predetermined divider cell corresponds to the determination result.

2. The multi-modulus divider of claim 1, wherein the numerical intervals comprise an interval ranging from $2^K$ to $2^{(K+1)}-1$, and K is a positive integer greater than or equal to 4.

3. The multi-modulus divider of claim 1, wherein the pulse generating circuit controls an edge of the pulse signal to fall within a predetermined time interval.

4. The multi-modulus divider of claim 3, wherein the divider cells comprise a first divider cell for receiving the input frequency, a second divider cell for receiving an output frequency of the first divider cell, and a third divider cell for receiving an output frequency of the second divider cell; and the second divider cell outputs a second modulus signal to the first divider cell, and the third divider cell outputs a third modulus signal to the second divider cell, and the predetermined time interval is a time interval between an edge of the third modulus signal and an edge of the second modulus signal.

5. The multi-modulus divider of claim 4, wherein the pulse generating circuit samples the third modulus signal with the output frequency of the second divider cell to generate the pulse signal.

6. The multi-modulus divider of claim 4, wherein the pulse generating circuit samples the third modulus signal with the output frequency of the first divider cell to generate the pulse signal.

7. The multi-modulus divider of claim 4, wherein the pulse generating circuit delays the third modulus signal to generate the pulse signal.

8. The multi-modulus divider of claim 1, wherein the modulus signal generating circuit comprises:

an interval determination logic circuit, for generating the determination result by determining which numerical interval the divisor belongs to according to some or all bits of the divisor; and a logic output circuit, coupled to the interval determination logic circuit, the pulse generating circuit, and the predetermined divider cell, for inputting, according to the determination result, the pulse signal into the predetermined divider cell, the pulse signal being one of the references when the predetermined divider outputs the first modulus signal.

9. The multi-modulus divider of claim 1, wherein the predetermined divider cell comprises:

a dividing module; and a modulus signal processing circuit, coupled to the dividing module and the modulus signal generating circuit, the modulus signal processing circuit comprising:

a first logic circuit, coupled to the dividing module, for generating a first output signal according to an output of the dividing module and an input modulus signal;

a second logic circuit, coupled to first logic circuit and the modulus signal generating circuit, for generating a second output signal according to the first output signal and the pulse signal; and a third logic circuit, coupled to second logic circuit, for generating the modulus signal according to the second output signal.

10. The multi-modulus divider of claim 1, being installed in a fractional-N synthesizer.

11. A method for performing frequency dividing by utilizing a multi-modulus divider, the multi-modulus dividing circuit comprising a plurality of divider cells connected in series, a predetermined divider cell of the divider cells being able to be bypassed, and the multi-modulus dividing circuit generating an output frequency according to an input frequency and a divisor, a range of the divisor comprising a plurality of numerical intervals, the method comprising:

generating a pulse signal;

generating a determination result by determining which numerical interval the divisor belongs to; and inputting, according to the determination result, the pulse signal into the predetermined divider cell to be one of the references which the predetermined divider cell refers to when outputting a first modulus signal, wherein the predetermined divider cell corresponds to the determination result.

12. The method of claim 11, wherein the numerical intervals comprise an interval ranging from $2^K$ to $2^{(K+1)}-1$, and K is a positive integer greater than or equal to 4.

13. The method of claim 11, wherein an edge of the pulse signal falls within a predetermined time interval.

14. The method of claim 13, wherein the divider cells comprise a first divider cell for receiving the input frequency, a second divider cell for receiving an output frequency of the first divider cell, and a third divider cell for receiving an output frequency of the second divider cell; and the second divider cell outputs a second modulus signal to the first divider cell, and the third divider cell outputs a third modulus signal to the second divider cell, and the predetermined time interval is a time interval between an edge of the third modulus signal and an edge of the second modulus signal.

15. The method of claim 14, wherein the step of generating the pulse signal comprises sampling the third modulus signal with the output frequency of the second divider cell.

16. The method of claim 14, wherein the step of generating the pulse signal comprises sampling the third modulus signal with the output frequency of the first divider cell.

17. The method of claim 14, wherein the step of generating the pulse signal comprises delaying the third modulus signal.

18. The method of claim 11, wherein the step of generating the determination result comprises:

generating the determination result by determining which numerical interval the divisor belongs to according to some or all bits of the divisor.

19. The method of claim 11, wherein the predetermined divider cell comprises a dividing module and a modulus signal processing circuit coupled to the dividing module; and the modulus signal processing circuit performs a logic operation according to an output of the dividing module and an input modulus signal to generate a first output signal, performs a logic operation according to the first output signal and the pulse signal to generate a second output signal, and generates the modulus signal according to the second output signal.

20. The method of claim 11, being applied to a fractional-N synthesizer.

* * * * *